United States Patent
Chen et al.

[11] Patent Number: 6,064,475
[45] Date of Patent: May 16, 2000

[54] REAL TIME LOCAL DEFOCUS MONITOR SYSTEM USING MAXIMUM AND MEAN ANGLES OF FOCUS CORRECTION

[75] Inventors: Hung-Chih Chen, Hsin-Chu; Yao-Chanet Chu, Tainan; Tzu-Yu Lin, Hsin-Chu; Chih-Chien Hung, Hsin-Ch, all of Taiwan

[73] Assignee: Taiwan Semiconductor Manufacturing Company, Hsin-Chu, Taiwan

[21] Appl. No.: 09/329,780

[22] Filed: Jun. 10, 1999

[51] Int. Cl.[7] .................................................. G01C 1/00
[52] U.S. Cl. ........................ 356/138; 356/394; 356/426; 414/936
[58] Field of Search .............................. 382/255; 414/936

[56] References Cited

U.S. PATENT DOCUMENTS

| | | | |
|---|---|---|---|
| 4,758,094 | 7/1988 | Wihl et al. | 356/394 |
| 5,124,927 | 6/1992 | Hopewell et al. | 364/468 |
| 5,202,748 | 4/1993 | MacDonald et al. | 356/360 |
| 5,563,684 | 10/1996 | Stagaman | 355/72 |
| 5,673,208 | 9/1997 | Meier et al. | 364/525 |
| 5,773,315 | 6/1998 | Jarvis | 438/14 |
| 5,828,455 | 10/1998 | Smith et al. | 356/354 |
| 5,884,242 | 3/1999 | Meier et al. | 702/179 |

*Primary Examiner*—Robert H. Kim
*Assistant Examiner*—Philip S. Natividad
*Attorney, Agent, or Firm*—George O. Saile; Stephen B. Ackerman; Larry J. Prescott

[57] ABSTRACT

An apparatus and method for determining local de-focus problems on a real time basis in a wafer exposure system. The distance of a wafer from an objective lens and rotation of the wafer about two orthogonal axis at each field position is adjusted to achieve optimum focus for each field of the wafer. The rotational data is fed to a computer and analyzed to determine if any of the rotational angles or if the difference between individual rotational angle and the mean rotational angle exceed critical angles. If any of the critical angles are exceeded local de-focus will occur and the exposure system must be checked for defects. If none of the critical angles are exceeded processing continues with the next wafer. The comparison of the rotational angles to the critical angles is performed for each wafer before continuing with the next wafer so that problems are discovered on a real time basis.

14 Claims, 4 Drawing Sheets

REAL TIME LOCAL DEFOCUS MONITOR SYSTEM USING MAXIMUM AND MEAN ANGLES OF FOCUS CORRECTION

BACKGROUND OF THE INVENTION

(1) Field of The Invention

This invention relates to the local defocus, within an image field, for photolithographic patterns on integrated circuit wafers, and more particularly to a method and system for real time detection of local defocus problems.

(2) Description of The Related Art

Photolithographic processing is critical to the fabrication of integrated circuit wafers. In the photolithographic processing operations a key step is that of focussing a pattern on a layer of photoresist. Lack of focus of the image degrades the accuracy of the pattern transferred to the photoresist. Local defocus caused by such problems as lack of planarity of the photoresist surface is an important problem in photolithographic processing.

U.S. Pat. No. 5,563,684 to Stagaman describes an adaptive wafer modulator to elastically deform the exposure area of the wafer to correct for lack of planarity of the un-deformed wafer surface.

U.S. Pat. No. 5,828,455 to Smith et al. describes methods of measurement and data analysis for correction of an optical system used in forming images in a layer of photoresist.

U.S. Pat. No. 5,202,748 to MacDonald et al. describes an in-situ process control system for controlling the focus of photolithographic steppers.

U.S. Pat. No. 4,758,094 to Wihl et al. describes a process and apparatus for in-situ qualifying a reticle or master pattern used in patterning systems.

U.S. Pat. No. 5,773,315 to Jarvis describes a method of predicting yields for processes having two or more masking steps.

SUMMARY OF THE INVENTION

In the forming of patterns in a layer of photoresist formed on an integrated circuit wafer a wafer exposure system is used to focus a pattern on the layer of photoresist. The pattern is exposed one field at a time on the layer of photoresist using a wafer exposure system. The image is focussed at each field and the focus operation includes rotation about two orthogonal axes, X and Y, both axes being perpendicular to the principal optical axis, Z, of the objective lens used to form the image at each field. However, localized defects, such as contamination on the back of the wafer, can cause local defocus to occur wherein there is a local defocus of images within a field. These local defocus problems cause poor pattern accuracy and low yields.

Typically wafer exposure systems are periodically checked for accuracy, including local defocus problems. When problems occur, however, many product wafers can be lost between the times the system is checked.

It is a principal objective of this invention to provide a method of real time checking of wafer exposure systems for local defocus problems.

It is another principal objective of this invention to provide an apparatus for real time checking of wafer exposure systems for local defocus problems.

These objectives are achieved by using a wafer exposure system which focusses an image at each field wherein the focus operation includes rotation about two orthogonal axes, X and Y, both axis being perpendicular to the principal optical axis, Z, of the objective lens used to form the image. The angles of rotation required to produce optimum focus about the X and Y axes at each field location are fed to a computer system and analyzed to determine the maximum rotational angle for optimum focus, minimum rotational angle for optimum focus, and mean rotational angle for optimum focus about each of the X and Y axes.

If the maximum rotation angle for optimum focus about either of the X or Y axes exceeds a first critical angle or the maximum deviation from the mean rotational angle for optimum focus about either of the X or Y axes exceed a second critical angle there will be local defocus problems. Whether or not these critical angles are exceeded can be determined immediately and corrective action can be taken without processing additional wafers. Experience has shown that if these critical angles are not exceeded local defocus problems will not occur.

DESCRIPTION OF THE PREFERRED EMBODIMENTS

Figure 1:
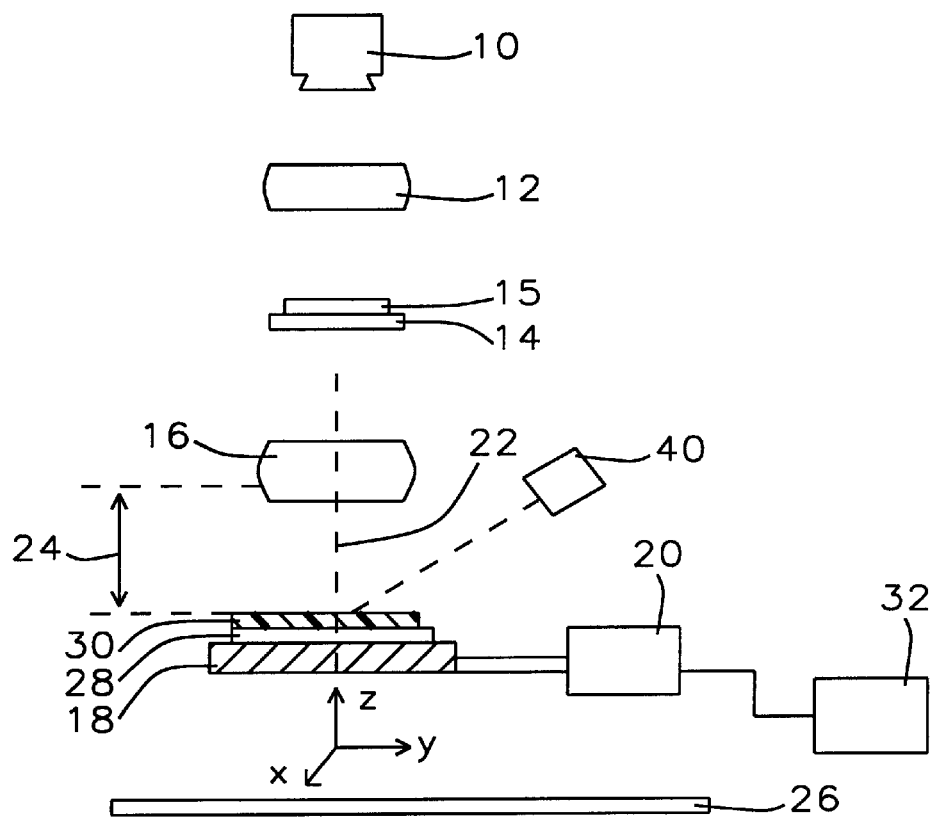
FIG. 1 shows a schematic view of a wafer exposure system.

Refer now to FIGS. 1–4 for a description of the preferred embodiments of the apparatus and method of this invention. FIG. 1 shows a schematic diagram of a wafer exposure system having a light source 10, a condensing lens 12, a mask holder 14, an objective lens 16, and a wafer holder 18. The objective lens 16 has a principal optical axis 22 which is perpendicular to a reference plane 26. The wafer holder 18 is mechanically coupled to a controller 20 which controls the location of the wafer holder 18 relative to the objective lens 16. The controller 20 has data inputs and outputs which are connected to a computer 32.

A wafer 28, having a layer of photoresist 30 formed thereon, is placed in the wafer holder 18. The controller 20 controls the position of the wafer holder 18 so that the distance 24 of the layer of photoresist 18 from the objective lens 16 is controlled by the controller 20. The controller 20 also controls rotation of the wafer holder 18, and thereby the layer of photoresist 30, about orthogonal X and Y axes, wherein both the X and Y axes are orthogonal to the principal optical axis 22. The wafer exposure system can also have a detector 40, either automatic or manual, to determine when an image formed on the layer of photoresist 30 achieves optimum focus, the best focus possible at the location.

Figure 2:
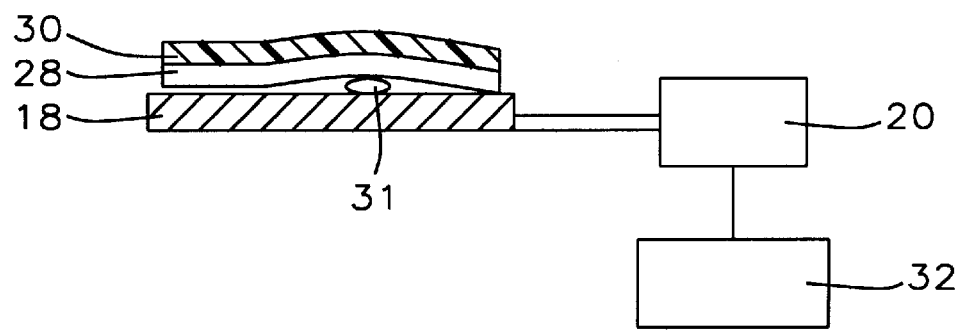
FIG. 2 shows a cross section view of a wafer on a wafer holder showing the effect of contamination on the back of the wafer. The wafer holder is connected to a controller which is electrically connected to a computer.
Figure 3:
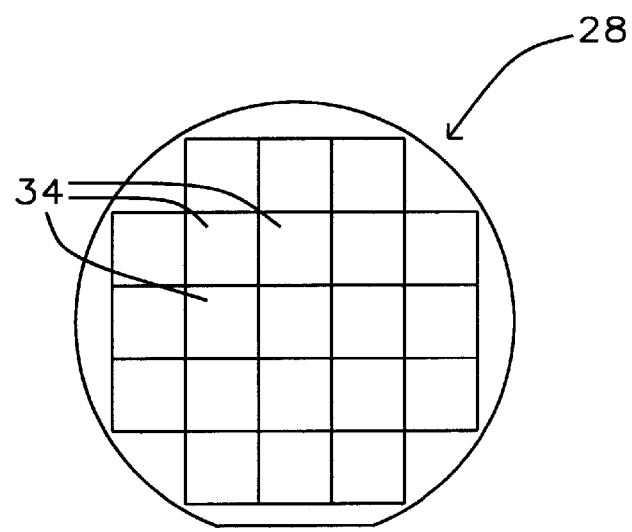
FIG. 3 shows a top view of a wafer showing the fields to be exposed.

FIG. 2 shows a schematic view of the wafer holder 18 holding the wafer 28 with a layer of photoresist 30, the controller 20, and the computer 32 of the wafer exposure system. FIG. 3 shows the top view of the wafer 28 on which the image will be exposed using the wafer exposure system.

FIG. 3 shows a number of image fields 34. Referring again to FIGS. 1 and 2, the controller 20 positions the wafer holder 18 so that the distance 24 from the layer of photoresist 30 to the objective lens 16 of the exposure system places the layer of photoresist 30 as close to the plane where the image will be in focus as possible. The focus needs to be fine tuned to achieve optimum focus at each field 34 of the wafer because the layer of photoresist may not be precisely in a single plane. FIG. 2 shows a possible problem which can disturb the focus at different fields, showing a contamination particle 31 on the back of the wafer 28 which can cause distortion of the photoresist surface.

Figure 4A:
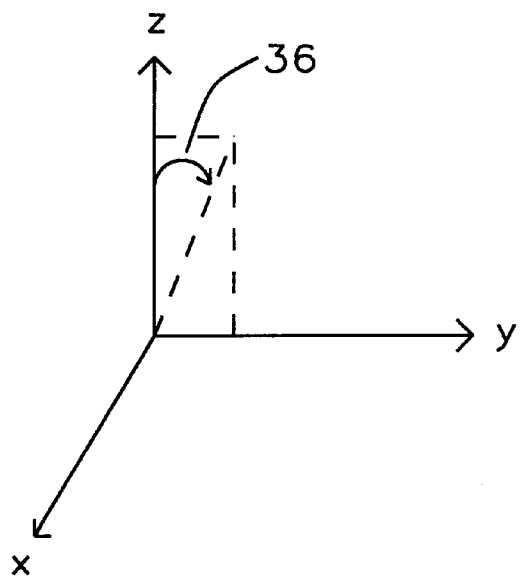
FIG. 4A shows rotation of the first angle about the X axis.
Figure 4B:
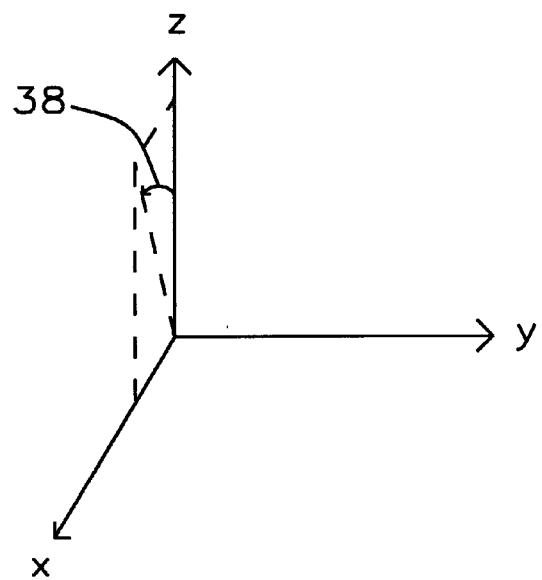
FIG. 4B shows rotation of the second angle about the Y axis.

First the controller 20 positions the wafer holder so that the exposure system focuses the image on one of the image fields, reference number 34 in FIG. 3, of the wafer and positions the distance 24 between the objective lens 16 and the layer of photoresist 30 to obtain the best focus possible. To fine tune the focus the controller 20 then rotates the wafer holder 18, and thereby the layer of photoresist 30, a first angle 36, see FIG. 4A, about the X axis and a second angle 38, see FIG. 4B, about the Y axis to obtain the best focus possible at the selected field. The detector 40 can be used to determine when the best focus possible, or optimum focus, is achieved. FIGS. 4A and 4B show the first angle 36 and second angle 38 separately for clarity of the diagram, however during an actual focus operation the wafer holder will be rotated both the first angle 36 and the second angle 38.

There can be local de-focus within a field, lack of precise focus in certain parts of the field, even with the rotation of the wafer holder about the X and Y axes at each field. The wafer exposure system uses rotation of the wafer holder about the X and Y axes to compensate for local de-focus problems, however in more severe cases this compensation is insufficient. This local de-focus can be caused by problems such as particle contamination 31 between the back of the wafer and the wafer holder, as shown in FIG. 2, or similar problems. When wafer exposure systems are checked periodically, such as two or three times per day, problems of this type can affect a number of wafers before being discovered.

The key to this invention is the analysis of the data for rotation of the wafer holder a first angle about the X axis and a second angle about the Y axis to achieve optimum focus at each field position on the wafer. Analysis of this data for a large number of wafers indicates that defects in the wafer exposure system, such as particulate contamination on the wafer holder or wafer back, can be identified by comparison of the rotational angles required to achieve optimum focus to two critical angles for each wafer.

If the maximum first angle or the maximum second angle in a wafer are greater than a first critical angle; or if the magnitude of the difference between the maximum first angle and the mean first angle in a wafer, the magnitude of the difference between the minimum first angle and the mean first angle in a wafer, the magnitude of the difference between the maximum second angle and the mean second angle in a wafer, or the magnitude of the difference between the minimum second angle and the mean second angle are greater than a second critical angle defects have been introduced into the wafer exposure system and local de-focus will be a problem. If, however, the maximum first angle and the maximum second angle in a wafer are equal to or less than the first critical angle; and if the magnitude of the difference between the maximum first angle and the mean first angle in a wafer, the magnitude of the difference between the minimum first angle and the mean first angle in a wafer, the magnitude of the difference between the maximum second angle and the mean second angle in a wafer, and the magnitude of the difference between the minimum second angle and the mean second angle are all equal to or less than the second critical angle local de-focus will not be a problem. In this example the first critical angle is about 300 micro radians and the second critical angle is about 150 micro radians. If the first critical and the second critical angle are exceeded the wafer exposure system must be inspected for defects and those defects corrected before additional wafers are processed. This provides an apparatus and method for real time identification of defects which will cause local de-focus problems.

Figure 5:
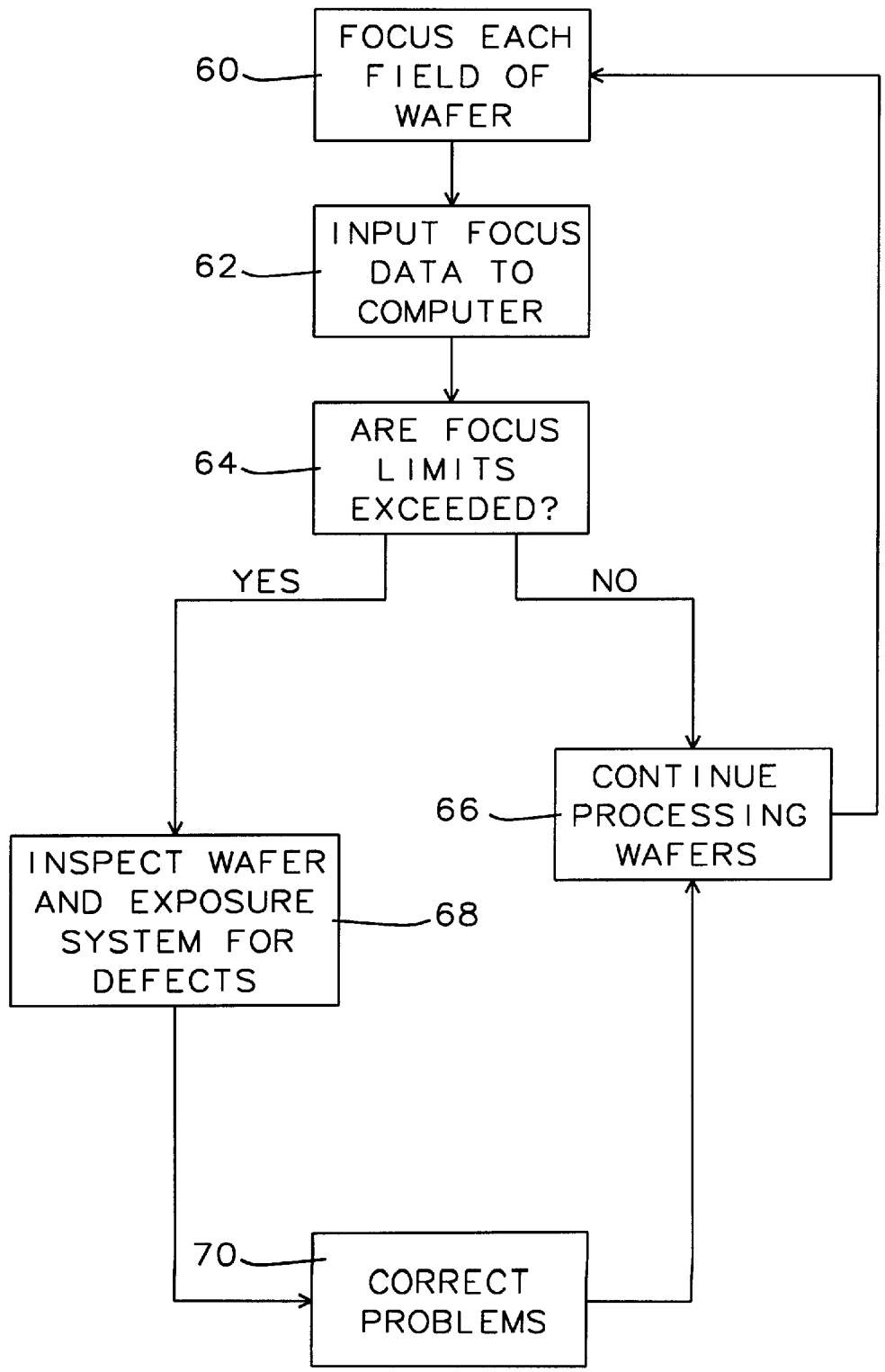
FIG. 5 shows a block diagram of the method of monitoring a wafer exposure system of this invention.

FIG. 5 shows a block diagram of the preferred method of this invention. In the first block 60 each field of the wafer is focussed including adjusting the distance from the layer of photoresist to the objective lens, rotation of the wafer holder a first angle about the X axis, and rotation of the wafer holder a second angle about the Y axis. As indicated in the next block 62, the rotational data is fed to a computer. As indicated in the next block 64, the computer analyzes the rotational data to determine if either the first or the second critical angles have been exceeded, as described in the preceding paragraph. If neither the first critical angle nor the second critical angle have been exceeded processing continues with the next wafer, as indicated in block 66. If, however, either the first critical angle or the second critical angle have been exceeded processing of additional wafers is suspended and the wafer exposure system must be inspected for defects, as indicated in block 68. After defects have been determined and corrected, as indicated in block 70, wafer processing continues with the next wafer, as indicated in block 66.

This apparatus and method identify defects which can be introduced into the wafer exposure system on a real time basis. The comparison of the rotational angles to the first and second critical angles is performed on each wafer as the wafer is being processed. If defects have been introduced the method identifies a problem before additional wafers are processed.

While the invention has been particularly shown and described with reference to the preferred embodiments thereof, it will be understood by those skilled in the art that various changes in form and details may be made without departing from the spirit and scope of the invention.

What is claimed is:

1. A method of monitoring local focus accuracy, comprising:

providing a wafer exposure system having a mask holder, a wafer holder, an objective lens having a principal optical axis, and a controller having data inputs and outputs, wherein said controller positions said wafer holder relative to said objective lens;

providing a first number of wafers;

selecting a wafer from said first number of wafers wherein said selected wafer has a number of image fields and a layer of resist formed thereon;

placing said selected wafer in said wafer holder;

providing a mask having an image formed therein;

placing said mask in said mask holder;

positioning said selected wafer so that, for each of said image fields, said layer of resist is a distance from said objective lens, said layer of resist is rotated a first angle about a first axis perpendicular to said principal optical axis, and said layer of resist is rotated a second angle about a second axis perpendicular to said principal optical axis and perpendicular to said first axis, thereby achieving optimum focus of said mask image on said layer of resist in each of said image fields of said wafer;

determining the maximum value of said first angles, the minimum value of said first angles, the mean value of said first angles, the difference between each of said first angles and the mean value of said first angles, the maximum value of said second angles, the minimum value of said second angles, the mean value of said second angles, and the difference between each of said second angles and the mean value of said second angles;

selecting another wafer for exposure if said maximum value of said first angles and said maximum value of said second angles are less than a first critical angle, the magnitude of the difference between each of said first angles and said mean value of said first angles are all less than a second critical angle, and the magnitude of the difference between each of said second angles and the mean value of said second angles are all less than said second critical angle, wherein said first critical angle is about 300 micro radians and said second critical angle is about 150 micro radians; and taking corrective action if said maximum value of said first angles and said maximum value of said second angles are equal to or greater than said first critical angle, the magnitude of the difference between any of said first angles and said mean value of said first angles is equal to or greater than said second critical angle, or the magnitude of the difference between any of said second angles and said mean value of said second angles is equal to or greater than said second critical angle.

2. The method of claim 1 further comprising a computer connected to said data inputs and outputs of said controller.

3. The method of claim 1 wherein said determining the maximum value of said first angles, the minimum value of said first angles, the mean value of said first angles, the difference between each of said first angles and the mean value of said first angles, the maximum value of said second angles, the minimum value of said second angles, the mean value of said second angles, and the difference between each of said second angles and the mean value of said second angles is accomplished using a computer.

4. The method of claim 1 wherein said corrective action comprises inspecting said selected wafer for defects.

5. The method of claim 1 wherein said corrective action comprises inspecting said wafer holder for defects.

6. A method of monitoring local focus accuracy, comprising:

providing a wafer exposure system having a mask holder, a wafer holder, an objective lens having a principal optical axis, and a controller having data inputs and outputs, wherein said controller positions said wafer holder relative to said objective lens;

providing a wafer having a number of image fields and a layer of resist formed thereon;

placing said wafer in said wafer holder;

providing a mask having an image formed therein;

placing said mask in said mask holder;

positioning said wafer so that, for each of said image fields, said layer of resist is a distance from said objective lens, said layer of resist is rotated a first angle about a first axis perpendicular to said principal optical axis, and said layer of resist is rotated a second angle about a second axis perpendicular to said principal optical axis and perpendicular to said first axis, thereby achieving optimum focus of said mask image on said layer of resist in each of said image fields of said wafer;

determining the maximum value of said first angles, the minimum value of said first angles, the mean value of said first angles, the difference between each of said first angles and the mean value of said first angles, the maximum value of said second angles, the minimum value of said second angles, the mean value of said second angles, and the difference between each of said second angles and the mean value of said second angles; and taking corrective action if said maximum value of said first angles and said maximum value of said second angles are equal to or greater than a first critical angle, the magnitude of the difference between any of said first angles and said mean value of said first angles is equal to or greater than a second critical angle, or the magnitude of the difference between any of said second angles and said mean value of said second angles is equal to or greater than said second critical angle, wherein said first critical angle is about 300 micro radians and said second critical angle is about 150 micro radians.

7. The method of claim 6 further comprising connecting a computer to said data inputs and outputs of said controller.

8. The method of claim 6 wherein said determining the maximum value of said first angles, the minimum value of said first angles, the mean value of said first angles, the difference between each of said first angles and the mean value of said first angles, the maximum value of said second angles, the minimum value of said second angles, the mean value of said second angles, and the difference between each of said second angles and the mean value of said second angles is accomplished using a computer.

9. The method of claim 6 wherein said corrective action comprises inspecting said selected wafer for defects.

10. The method of claim 6 wherein said corrective action comprises inspecting said wafer holder for defects.

11. An apparatus for monitoring local focus accuracy, comprising:

a wafer exposure system having a mask holder, a wafer holder, an objective lens having a principal optical axis, and a controller having data inputs and outputs, wherein said controller positions said wafer holder relative to said objective lens;

a computer connected to said data inputs and outputs of said controller;

means for positioning said wafer holder so that, when optimum focus of an image on an image field of a wafer, held by said wafer holder, is achieved, said wafer holder is a distance from said objective lens, said wafer holder is rotated a first angle about a first axis perpendicular to said principal optical axis, and said wafer holder is rotated a second angle about a second axis perpendicular to said principal optical axis and perpendicular to said first axis;

means to determine the maximum value of said first angles, the minimum value of said first angles, the mean value of said first angles, the difference between each of said first angles and the mean value of said first angles, the maximum value of said second angles, the minimum value of said second angles, the mean value of said second angles, and the difference between each of said second angles and the mean value of said second angles; and means to identify if said maximum value of said first angles and said maximum value of said second angles are equal to or greater than a first critical angle, the magnitude of the difference between any of said first angles and said mean value of said first angles is equal to or greater than a second critical angle, or the magnitude of the difference between any of said second angles and said mean value of said second angles is equal to or greater than said second critical angle, wherein said first critical angle is about 300 micro radians and said second critical angle is about 150 micro radians.

12. The apparatus of claim 11 wherein said means for positioning said wafer holder comprises said controller.

13. The apparatus of claim 11 wherein said means to determine the maximum value of said first angles, the minimum value of said first angles, the mean value of said first angles, the difference between each of said first angles and the mean value of said first angles, the maximum value of said second angles, the minimum value of said second angles, the mean value of said second angles, and the difference between each of said second angles and the mean value of said second angles comprises said computer.

14. The apparatus of claim 11 wherein said means to identify if said maximum value of said first angles and said maximum value of said second angles are equal to or greater than said first critical angle, the magnitude of the difference between any of said first angles and said mean value of said first angles is equal to or greater than said second critical angle, or the magnitude of the difference between any of said second angles and said mean value of said second angles is equal to or greater than said second critical angle comprises said computer.

* * * * *